US012785685B2

(12) United States Patent
Miyagawa et al.

(10) Patent No.: US 12,785,685 B2
(45) Date of Patent: Nov. 3, 2026

(54) STEERING WHEEL UNIT

(71) Applicant: ALPS ALPINE CO., LTD., Tokyo (JP)

(72) Inventors: Hayato Miyagawa, Gwangju (KR); Shinya Abe, Miyagi (JP)

(73) Assignee: ALPS ALPINE CO., LTD., Tokyo (JP)

( * ) Notice: Subject to any disclaimer, the term of this patent is extended or adjusted under 35 U.S.C. 154(b) by 139 days.

(21) Appl. No.: 19/036,751

(22) Filed: Jan. 24, 2025

(65) Prior Publication Data

US 2025/0175176 A1 May 29, 2025

Related U.S. Application Data

(63) Continuation of application No. PCT/JP2023/007792, filed on Mar. 2, 2023.

(30) Foreign Application Priority Data

Aug. 5, 2022 (JP) ................................ 2022-125647

(51) Int. Cl.
*H03K 17/96* (2006.01)
*B62D 1/06* (2006.01)
*G01D 5/24* (2006.01)

(52) U.S. Cl.
CPC ............ *H03K 17/962* (2013.01); *B62D 1/06* (2013.01); *G01D 5/2405* (2013.01)

(58) Field of Classification Search
CPC ........ H03K 17/962; B62D 1/06; B62D 1/046; G01D 5/2405; B60R 16/027; G01B 7/00
See application file for complete search history.

(56) References Cited

U.S. PATENT DOCUMENTS 10,677,950 B2 6/2020 Nishio et al.
2015/0035549 A1 2/2015 Sugiura
(Continued)

FOREIGN PATENT DOCUMENTS

DE 102015209106 11/2016
JP 2015-031552 2/2015
(Continued)

OTHER PUBLICATIONS

International Search Report for PCT/JP2023/007792 mailed on May 23, 2023.

*Primary Examiner* — Raul J Rios Russo
*Assistant Examiner* — Haidong Zhang
(74) *Attorney, Agent, or Firm* — IPUSA, PLLC

(57) ABSTRACT

In a steering wheel unit, when any one of electrostatic capacitances measured by a capacitance measurer while a self capacitance detection mode is set by a mode switcher is equal to or larger than a first threshold value, it is determined that the operator's hand is in contact with a rim at a position that overlaps at least one of electrodes. When the electrostatic capacitance is equal to or larger than a second threshold value, which is smaller than a first threshold value, and smaller than the first threshold value, the mode is switched to the mutual capacitance detection mode. After the switching, when an electrostatic capacitance newly measured in the mutual capacitance detection mode is equal to or larger than a third threshold value, it is determined that the operator's hand is in contact with the rim at a position that overlaps a gap between the electrodes.

8 Claims, 8 Drawing Sheets

(56) References Cited

U.S. PATENT DOCUMENTS

| | | | | |
|---|---|---|---|---|
| 2017/0183025 | A1* | 6/2017 | Okazaki | B62D 1/06 |
| 2017/0334392 | A1* | 11/2017 | Frey | B60K 35/10 |
| 2017/0334477 | A1* | 11/2017 | Bossler | G01D 5/2417 |
| 2018/0106924 | A1 | 4/2018 | Maeda et al. | |
| 2018/0118247 | A1* | 5/2018 | Odate | B60R 1/04 |
| 2018/0354543 | A1 | 12/2018 | Nishio et al. | |
| 2019/0025824 | A1 | 1/2019 | Odate | |
| 2019/0210629 | A1 | 7/2019 | Kwon et al. | |

FOREIGN PATENT DOCUMENTS

| | | |
|---|---|---|
| JP | 2017-188458 | 10/2017 |
| JP | 2018-065547 | 4/2018 |
| JP | 2018-067423 | 4/2018 |
| JP | 2019-023009 | 2/2019 |
| JP | 2021-146842 | 9/2021 |
| JP | 2021-165642 | 10/2021 |

* cited by examiner

STEERING WHEEL UNIT

CROSS-REFERENCE TO RELATED APPLICATIONS

This application is a continuation application of International Application No. PCT/JP2023/007792 filed on Mar. 2, 2023, and designated the U.S., which is based upon and claims priority to Japanese Patent Application No. 2022-125647 filed on Aug. 5, 2022, the entire contents of which are incorporated herein by reference.

BACKGROUND

1. Technical Field

The present disclosure relates to a steering wheel unit.

2. Description of Related Art

A steering wheel unit of a vehicle in which a sensor detects whether a human body is in contact with a steering wheel is known. Such a steering wheel unit includes electrostatic capacitance sensors arranged in the steering wheel to detect a magnitude of electrostatic capacitance associated with contact by a human body with the steering wheel, the outer peripheral portion of the rim of the steering wheel is provided with a sensing area for detecting whether a human body is in contact with the steering wheel with the electrostatic capacitance sensors, and the rim is further provided with a dead zone where contact by a human body with the steering wheel is not detected, the sensing area and the dead zone being respectively formed in a left portion of the rim, which is a relatively left portion when the steering wheel is in a neutral position, and a right portion, which is opposed to the left portion, with a center portion of the rim interposed therebetween (see Japanese Unexamined Patent Publication No. 2019-23009, hereinafter "Patent Document 1").

SUMMARY

According to an embodiment of the present disclosure, a steering wheel unit includes: a steering wheel including a rim, spokes, and a plurality of electrodes arranged with a gap from each other and covering the rim; a mode switcher configured to switch between a self capacitance detection mode and a mutual capacitance detection mode for the plurality of electrodes; a capacitance measurer configured to measure a respective first electrostatic capacitance at each of the plurality of electrodes; and a contact determiner configured to determine whether or not an operator's hand is in contact with the steering wheel based on the first electrostatic capacitances measured by the capacitance measurer. The mode switcher selects, in the mutual capacitance detection mode, a drive electrode from the plurality of electrodes and selects an electrode adjacent to the selected drive electrode as a detection electrode. In the self capacitance detection mode that is set by the mode switcher, when any one of the first electrostatic capacitances measured by the capacitance measurer is equal to or larger than a first threshold value, the contact determiner determines that the operator's hand is in contact with the rim at a position that overlaps at least one of the plurality of electrodes. When the any one first electrostatic capacitance measured by the capacitance measurer is equal to or larger than a second threshold value and smaller than the first threshold value, the second threshold value being smaller than the first threshold value, the contact determiner causes the mode switcher to switch the self capacitance detection mode to the mutual capacitance detection mode. After the switching, when a second electrostatic capacitance measured by the capacitance measurer in the mutual capacitance detection mode is equal to or larger than a third threshold value, the control unit determines that the operator's hand is in contact with the rim at a position that overlaps a gap between the electrodes.

DETAILED DESCRIPTION

In a conventional steering wheel unit, when a position of a hand touch on the steering wheel is in the dead zone, the hand touch is not detected. The electrostatic capacitance sensor is a type of a sensor that has a configuration for detecting self capacitance. In other words, although a dead zone is provided in the conventional steering wheel unit in order to avoid erroneous detection or erroneous operation in a hands-on-detection using self capacitance, a hand touch cannot be detected in the dead zone.

Since a steering wheel unit inevitably has a zone where a sensor cannot be arranged due to design and design constraints of the steering wheel unit, it is desirable to provide a steering wheel unit capable of determining where there is contact of an operator's hand even in a dead zone where a sensor is not present.

Hereinafter, an embodiment to which a steering wheel unit of the present disclosure is applied will be described.

Embodiment

Figure 1:
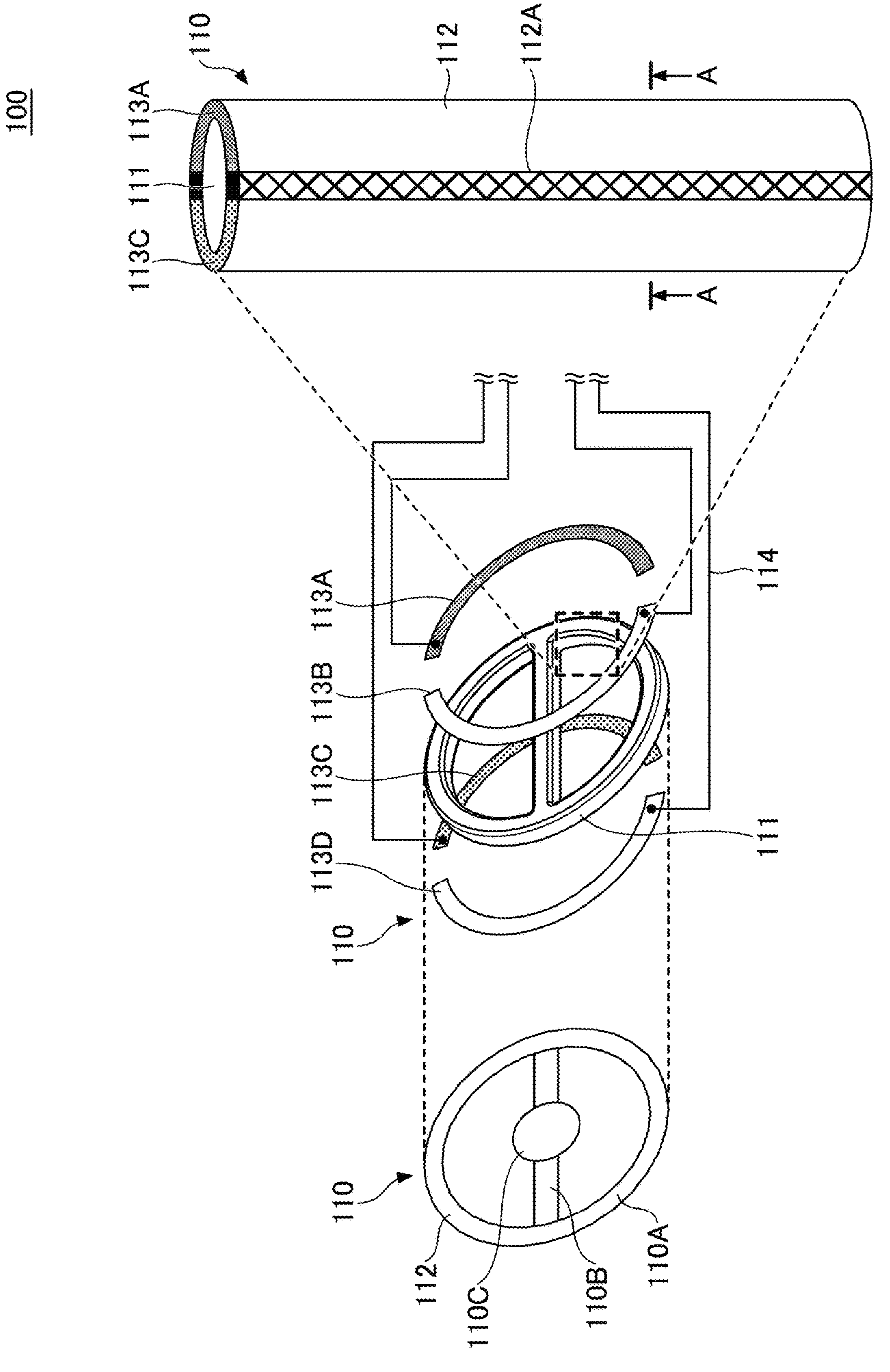
FIG. 1 is a diagram illustrating an example of a steering wheel included in a steering wheel unit according to an embodiment.

FIG. 1 is a diagram illustrating an example of a steering wheel 110 included in a steering wheel unit 100 according to an embodiment. The steering wheel 110 includes a rim 110A, spokes 110B, a hub 110C, a steering core 111, an exterior 112, and sensors 113A, 113B, 113C, and 113D. The sensors 113A to 113D are examples of a plurality of electrodes. In the following description, the configuration of the steering wheel 110 will be described with reference to the configuration as viewed from the driver's seat when the steering wheel 110 is mounted on the vehicle and is in a neutral state, unless otherwise specified. Further, a driver's seat side of the steering wheel 110 is referred to as a "front side", and the side of the steering wheel 110 on the front side of the vehicle is referred to as a "rear side".

The steering wheel 110 is illustrated on the left side of FIG. 1. In the center of FIG. 1, the steering wheel 110 is illustrated in an exploded manner. In the center of FIG. 1, the exterior 112 is omitted for visibility of the arrangement of the sensors 113A to 113D. On the right side of FIG. 1, the rim 110A of the steering wheel 110 is illustrated in a partially enlarged manner. A portion of the rim 110A is illustrated in a straight form on the right side of FIG. 1.

Although two spokes 110B extending from the hub 110C at the center of the steering wheel 110 to the left and right are illustrated in FIG. 1, the number of spokes 110B may be any number. Further, the rim 110A need not be circular annular, may be rectangular annular, D-shaped, or the like, and need not be annular at all. The steering core 111 has a shape similar to that of the steering wheel 110, and includes a rim and spokes. The rim and the spokes of the steering core 111 correspond to the rim 110A and the spokes 110B of the steering wheel 110.

The exterior 112 is a member that covers the rim of the steering core 111, and is a portion with which the operator's hands (driver) of the vehicle directly come into contact. The exterior 112 is made of, for example, genuine leather, artificial leather, or resin.

The exterior 112 is integrated with the sensors 113A to 113D, for example, and covers the rim of the steering core 111, with the sensors 113A to 113D being positioned between the exterior 112 and the rim of the steering core 111. The rim of the steering core 111 covered with the exterior 112, which is integrated with the sensors 113A to 113D, is the rim 110A of the steering wheel 110. By attaching a resin-made decorative member or the like to the spokes of the steering core 111, the spokes of the steering core 111 become the spokes 110B of the steering wheel 110.

The exterior 112 integrated with the sensors 113A to 113D is a sheet-like member before being attached to the rim of the steering core 111. The exterior 112 integrated with the sensors 113A to 113D and covering the rim of the steering core 111 is sewn, and a seam 112A is thereby formed. The seam 112A is formed along the circumferential direction of the rim 110A of the steering wheel 110. The seam 112A is formed, for example, on the inner peripheral side, the inner peripheral side and the outer peripheral side, or the outer peripheral side of the rim 110A of the steering wheel 110.

The sensors 113A to 113D are electrodes formed of a conductor, and are provided to detect whether the operator's hand is in contact with the steering wheel 110. A cable 114 connected to a hands-off detection electronic control unit (HODECU) or the like is connected to the sensors 113A to 113D. As the sensors 113A to 113D, for example, an electrode obtained by applying a silver paste to a plastic film or the like, or an electrode obtained by forming an aluminum foil, a copper foil, or the like on a plastic film or the like can be used.

The sensor 113A is located, for example, on the front side of the right half of the rim 110A, and the sensor 113B is located, for example, on the front side of the left half of the rim 110A. The sensor 113C is located, for example, on the rear side of the right half of the rim 110A, and the sensor 113D is located, for example, on the rear side of the left half of the rim 110A.

The electrostatic capacitance between the sensors 113A to 113D and the operator's hand changes depending on whether the operator's hand is in contact with the rim 110A of the steering wheel 110. The electrostatic capacitance between the sensors 113A to 113D and the operator's hand is different between when the operator's hand grips the rim 110A of the steering wheel 110 and when the operator's hand lightly touches the rim 110A. For example, the electrostatic capacitance when the operator grips the rim 110A is larger than the electrostatic capacitance when the operator lightly touches the rim 110A.

When the exterior 112 integrated with the sensors 113A to 113D is attached to the rim of the steering core 111, the sensors 113A to 113D are not present in the seam 112A; therefore, the electrostatic capacitance between the sensors 113A to 113D and the operator's hand is different between when the operator's hand is in contact with the seam 112A of the rim 110A of the steering wheel 110 and when the operator's hand is in contact with a portion other than the seam 112A of the rim 110A (a portion that overlaps at least one of the sensors 113A to 113D). The portion where the sensors 113A to the 113D are not present, such as the seam 112A, is an example of a position that overlaps the gap between the plurality of electrodes in the rim 110A of the steering wheel 110.

Hereinafter, a case where a portion in which the sensors 113A to 113D are not present in the rim 110A of the steering wheel 110 is the seam 112A will be described, but there may be a portion in which the sensors 113A to 113D are not present other than the seam 112A. For example, in the case where the exterior 112 is not sewn but is bonded, a portion illustrated as the seam 112A would be a joint of the exterior 112, and there may be a portion where the sensors 113A to 113D are not present in the joint.

For another example, in the case where the decorative member of the spokes 110B of the steering wheel 110 is provided to extend to the rim 110A, the exterior 112 integrated with the sensors 113A to 113D cannot be attached to a portion of the rim 110A of the steering wheel 110. Therefore, even when there is no seam 112A, there may be a portion where the sensors 113A to 113D are not present in the rim 110A of the steering wheel 110.

In the case where the seam 112A is not present in the outer peripheral side of the rim 110A, the gap between the sensor 113A positioned on the front side of the right half of the rim 110A and the sensor 113C positioned on the rear side of the right half of the rim 110A is a portion where no sensor is present. In the case where the seam 112A is not present in the outer peripheral side of the rim 110A, the gap between the sensor 113B positioned on the front side of the left half of the rim 110A and the sensor 113D positioned on the rear side of the left half of the rim 110A is a portion where no sensor is present. Further, the gap between the sensors 113A and 113B positioned on the front side of the rim 110A and the gap between the sensors 113C and 113D positioned on the rear side of the rim 110A are also portions where no sensor is present.

The steering wheel unit 100 of the embodiment can detect contact of the operator's hand with the rim 110A of the steering wheel 110, even when the operator's hand is in contact with a portion of the rim 110A of the steering wheel 110 where the sensors 113A to 113D are not present, such as the seam 112A. The details are described below.

<Outline of Method of Detecting Electrostatic Capacitance in Steering Wheel Unit 100 of Embodiment>

Figure 2:
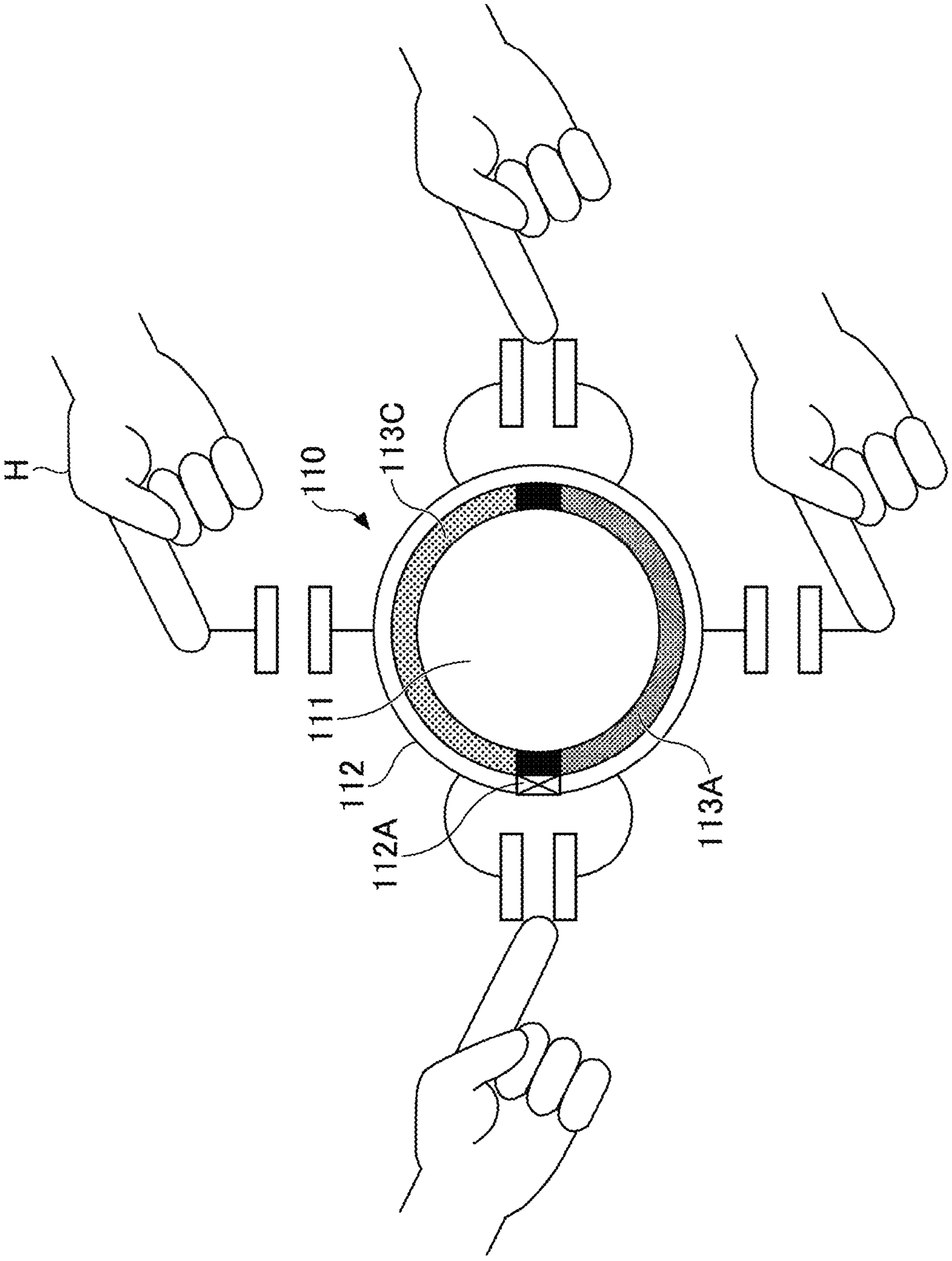
FIG. 2 is a diagram illustrating an example of a configuration of a cross section taken along line A-A in FIG. 1.

FIG. 2 is a diagram illustrating an example of a configuration of the cross section taken along line A-A in FIG. 1. Herein, an outline of a method of detecting an electrostatic capacitance in the steering wheel unit 100 of the embodiment will be described with reference to FIG. 2. In FIG. 2, the operator's hand H and the exterior 112 or the seam 112A are illustrated separated from each other in order to represent an electrostatic capacitance between the operator's hand H and the sensor 113A or 113C with a symbol of a capacitor, however, the description will be made on the assumption that the hand is in contact with the exterior 112 or the seam 112A.

As illustrated in FIG. 2, as an example, the seam 112A is provided on the inner peripheral side (the left side in FIG. 2) of the rim 110A of the steering wheel 110, and a dead zone where no sensor is present is provided on the outer peripheral side (the right side in FIG. 2). The seam 112A on the inner peripheral side and the dead zone on the outer peripheral side where no sensor is present correspond to the positions of the gap between the sensors 113A and 113C. The right half of the steering wheel 110 where the sensors 113A and 113C are provided is described herein; however, the descriptions hereinafter apply to the left half where the sensors 113B and 113D are provided, the front side where the sensors 113A and 113B are provided, and the rear side where the sensors 113C and 113D are provided.

In a self capacitance detection mode, the steering wheel unit 100 selects the sensor 113A or 113C as a detection electrode, and measures an electrostatic capacitance between the detection electrode and the ground. In the self capacitance detection mode, the detection electrode also functions as a drive electrode. In the self capacitance detection mode, in the case where the steering wheel unit 100 can measure a certain large electrostatic capacitance, the steering wheel unit 100 determines that the hand H is in contact with the steering wheel 110 at a position that overlaps the sensor 113A or 113C.

In the case where the steering wheel unit 100 cannot measure an electrostatic capacitance of a certain degree of magnitude with the sensor 113A or 113C in the self capacitance detection mode, the steering wheel unit 100 switches the detection mode to a mutual capacitance detection mode. Then, the steering wheel unit 100 selects either one of the sensors 113A and 113C as a drive electrode, selects the electrode adjacent to the drive electrode (the other of the sensors 113A and 113C) as a detection electrode, and measures an electrostatic capacitance between the drive electrode and the detection electrode. In the mutual capacitance detection mode, in the case where the steering wheel unit 100 can measure an electrostatic capacitance of a certain degree of magnitude, the steering wheel unit 100 determines that the hand H is in contact with the steering wheel 110 at a position that overlaps the seam 112A or the dead zone where no sensor is present.

<Configuration of Steering Wheel Unit 100>

Figure 3:
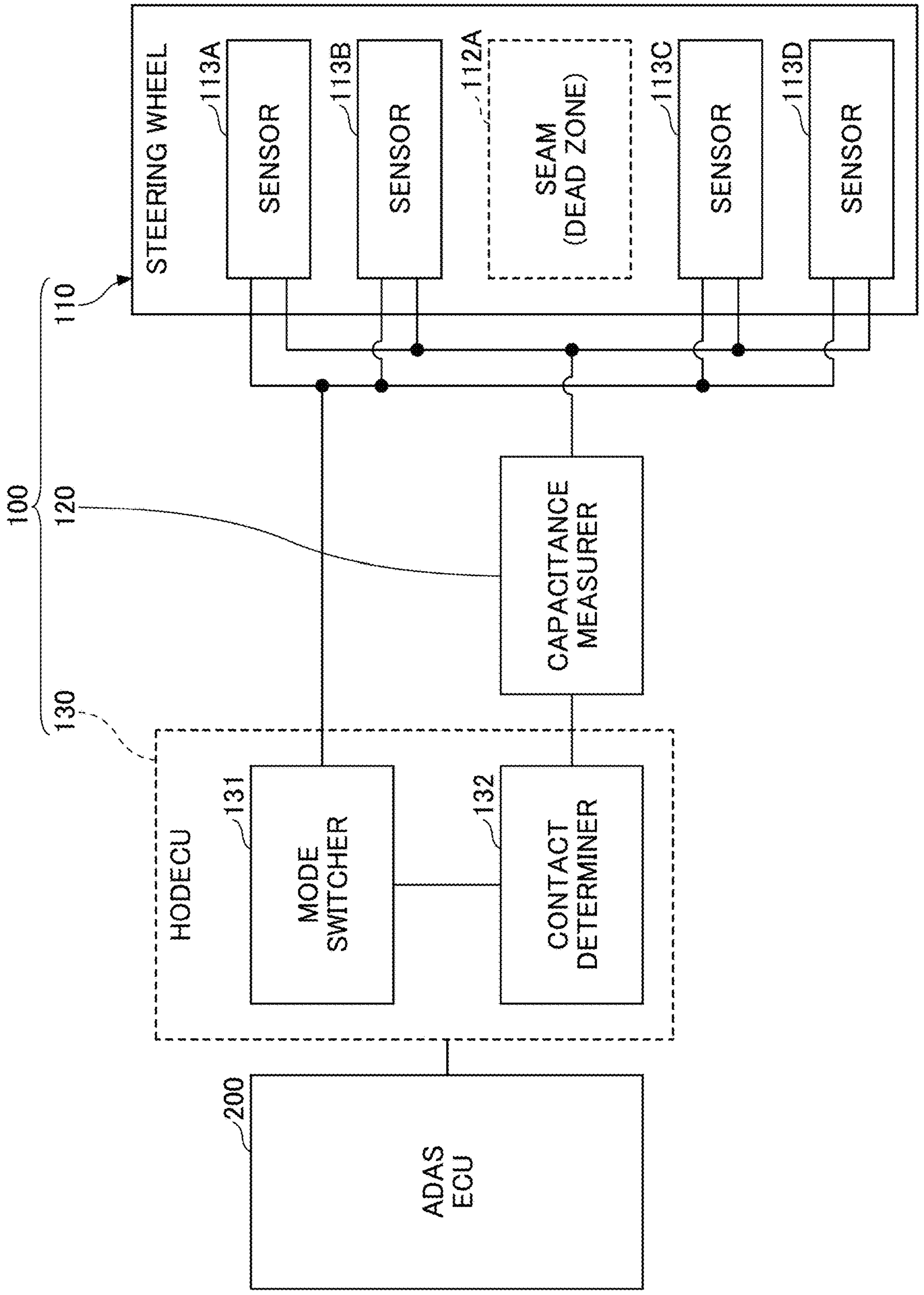
FIG. 3 is a diagram illustrating an example of a configuration of a steering wheel unit according to the embodiment.

FIG. 3 is a diagram illustrating an example of a configuration of the steering wheel unit 100 according to the embodiment. The steering wheel unit 100 includes the steering wheel 110, a capacitance measurer 120, and the HODECU 130. The HODECU 130 includes a mode switcher 131 and a contact determiner 132. The HODECU 130 is connected to an advanced driver-assistance system electronic control unit (ADASECU) 200. The ADASECU 200 is, for example, a device configured to control a system that performs advance driving assistance, such as an automatic driving system. The automatic driving system may be, for example, Level 3 or higher of automatic driving Level 0 to 5 defined by Society of Automotive Engineers of Japan, Inc. (JSAE).

In FIG. 3, only the sensors 113A to 113D and the seam 112A of the steering wheel 110 are illustrated. The seam 112A is a dead zone in which the sensors 113A to 113D are not present.

The capacitance measurer 120 is a measurement circuit that is provided between the sensors 113A to 113D and the contact determiner 132 of the HODECU 130, and is configured to convert analog outputs from the sensors 113A to 113D into digital outputs and output the digital outputs to the contact determiner 132. An electrostatic capacitance digitally converted and output by the capacitance measurer 120 is a digitally converted value (raw value) before the HODECU 130 calculates a difference value (ΔAD) that represents a difference between a measured electrostatic capacitance and a predetermined reference value.

The HODECU 130 is implemented by a computer including a central processing unit (CPU), a random access memory (RAM), a read only memory (ROM), an input/output interface, an internal bus, and the like. The mode switcher 131 and the contact determiner 132 are functional blocks of functions provided by a program executed by the HODECU 130.

The mode switcher 131 selects the sensors 113A to 113D as a drive electrode or a detection electrode, and sets a mode by switching between self capacitance detection mode and the mutual capacitance detection mode. In the self capacitance detection mode, the mode switcher 131 selects each of the sensors 113A to 113D as a detection electrode in a time-division manner, and an electrostatic capacitance is measured by the capacitance measurer 120 as a self capacitance. In this case, the remaining three sensors not used for detecting an electrostatic capacitance may be used as shields.

The sensors 113A to 113D may be simultaneously selected as a detection electrode, and electrostatic capacitances may be measured as a self capacitance by the capacitance measurer 120. In this case, no shielding is set.

Here, shielding means driving a sensor not selected as a detection electrode to use for electrostatic capacitance detection at an arbitrary potential or at the ground level (0 V).

In the mutual capacitance detection mode, the mode switcher 131 selects one of the sensors 113A to 113D as a drive electrode and selects the sensor adjacent to the selected drive electrode as a detection electrode. The sensors 113A to 113D are adjacent to each other in a direction connecting the front side and the rear side of the steering wheel 110 or in the circumferential direction of the steering wheel 110. For this reason, the mode switcher 131 may select, for example, any one of the sensors 113A to 113D as a drive electrode and select the sensor adjacent to the selected drive electrode as a detection electrode. In the mutual capacitance detection mode, an electrostatic capacitance between the drive electrode and the detection electrode is measured as a mutual capacitance by the capacitance measurer 120.

The contact determiner 132 determines whether the operator's hand H is in contact with the rim 110A of the steering wheel 110 based on an electrostatic capacitance measured by the capacitance measurer 120. The details of the processing performed by the contact determiner 132 will be described with reference to the flowchart of FIG. 4.

<Flowchart>

Figure 4:
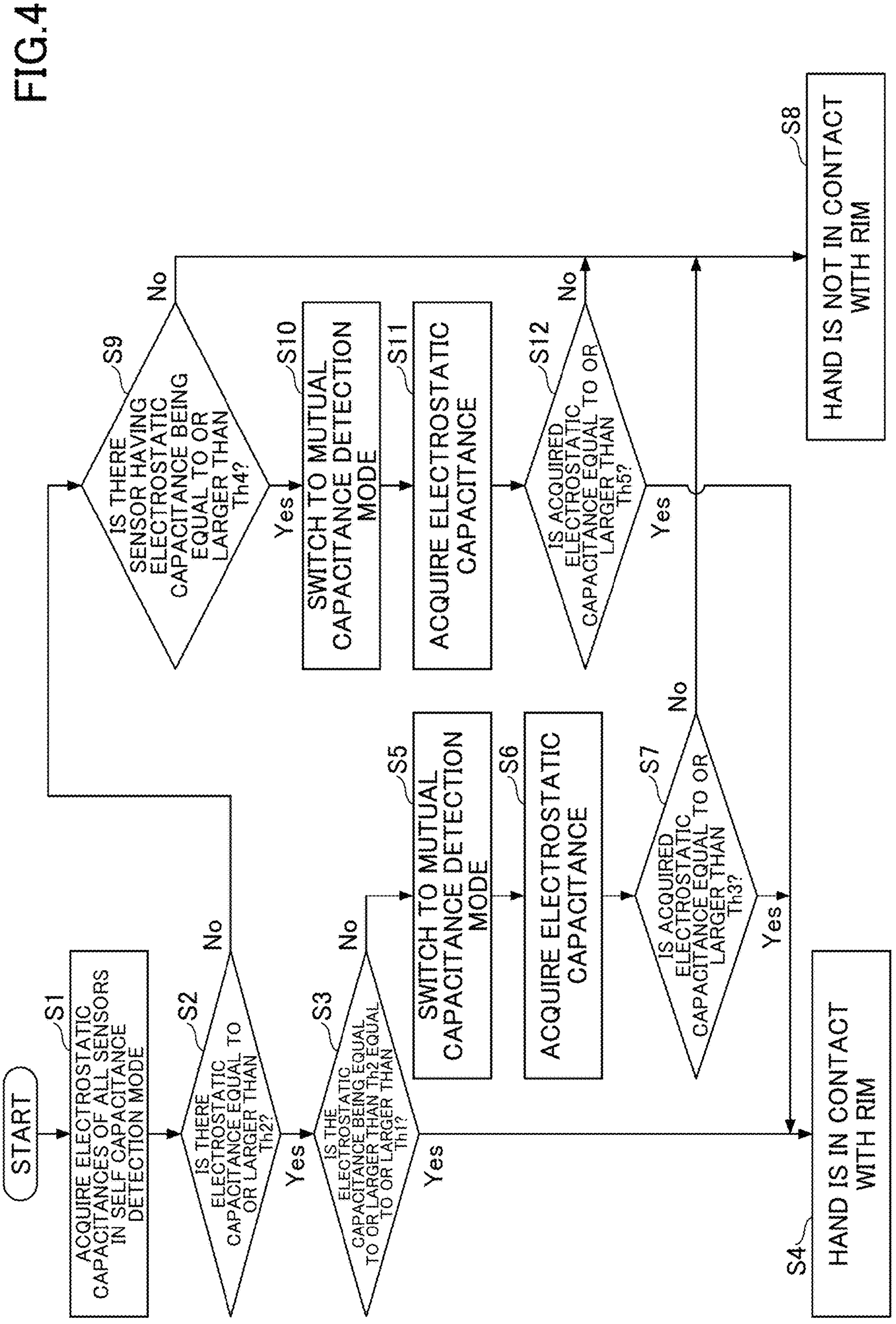
FIG. 4 is a flowchart illustrating an example of processing performed by a hands off detection electronic control unit (HODECU)

FIG. 4 is a flowchart illustrating an example of processing performed by the HODECU 130.

When the processing is started, the contact determiner 132 causes the mode switcher 131 to set the self capacitance detection mode, and acquires electrostatic capacitances sequentially measured in all the sensors 113A to 113D in a time-division manner by the capacitance measurer 120 (step S1). In step S1, the contact determiner 132 acquires digitally converted values (raw values), which are the electrostatic capacitances acquired by the capacitance measurer 120.

In step S1, the mode switcher 131 may drive three sensors other than the sensor that detects an electrostatic capacitance as a shield. The contact determiner 132 may cause the mode switcher 131 to perform such processing. By driving the three sensors other than the sensor that detects an electrostatic capacitance as a shield, it is possible to suppress the influence of the ground or the like around the sensor that detects an electrostatic capacitance, and to stably detect an electrostatic capacitance.

The contact determiner 132 calculates an electrostatic capacitance as a difference value (ΔAD) by subtracting a predetermined reference value from the digitally converted value (raw value), and determines whether or not there is an electrostatic capacitance equal to or larger than a threshold value Th2 among the acquired electrostatic capacitances (step S2). The threshold value Th2 is an example of a second threshold value, and is set to an electrostatic capacitance with which it can be determined, in the self capacitance detection mode, that the hand H is in contact with the rim 110A of the steering wheel 110 at any part including the seam 112A and the dead zone where no sensor is present. Even in the case where the hand H is in contact with the rim 110A of the steering wheel 110 at the dead zone, the electrostatic capacitance of at least one of the sensors 113A to 113D increases to some extent. For this reason, the contact determiner 132 detects contact of the hand H with the rim 110A of the steering wheel 110 at any part including the seam 112A and the dead zone where no sensor is present, using the threshold value Th2.

When the contact determiner 132 determines that there is an electrostatic capacitance equal to or larger than the threshold value Th2 among the acquired electrostatic capacitances (Yes in step S2), the contact determiner 132 then determines whether the electrostatic capacitance (ΔAD) is equal to or larger than the threshold value Th1 (step S3). The threshold value Th1 is an example of a first threshold value, and is set to an electrostatic capacitance with which it can be determined that the hand H is in contact with the rim 110A of the steering wheel 110 at a position that overlaps at least one of the sensors 113A to 113D. Herein, the position of the rim 110A that overlaps at least one of the sensors 113A to 113D is a portion of the rim 110A other than the seam 112A and the dead zone where no sensor is present.

In particular, the threshold value Th1 is set to a value with which detection of a firm gripping of the rim 110A with the hand H at a portion other than the seam 112A or the dead zone where no sensor is present is expected. In a state where the hand H firmly grips the seam 112A of the rim 110A or a portion other than the dead zone where no sensor is present, a very large electrostatic capacitance is acquired. In order to confirm that the hand H is in contact with the steering wheel 110, the processing in step S3 is provided.

Furthermore, by determining whether the hand H is in contact with the rim 110A at a position other than the seam 112A and the dead zone where no sensor is present after step S2 in which it is determined that the hand H is in contact with the rim 110A of the steering wheel 110 at any part including the seam 112A and the dead zone where no sensor is present (Yes in step S2), it is possible to distinguish between the case where the hand H is in contact with the seam 112A or the dead zone where no sensor is present and the case where the hand H is in contact with some other part of the rim 110A.

When the contact determiner 132 determines that the electrostatic capacitance is equal to or larger than the threshold value Th1 (Yes in step S3), the contact determiner 132 determines that the hand H is in contact with the rim 110A of the steering wheel 110 (step S4). When the contact determiner 132 completes the processing in step S4, the HODECU 130 transmits the determination result to the ADASECU 200, and returns the processing to the beginning.

When the contact determiner 132 determines that the electrostatic capacitance is not equal to or larger than the threshold value Th1 in step S3 (No in step S3), the contact determiner 132 causes the mode switcher 131 to switch the mode to the mutual capacitance detection mode (step S5). The mode switcher 131 selects, as a drive electrode, the sensor that has detected the electrostatic capacitance which has been determined to be equal to or larger than the threshold value Th2 in step S2 among the sensors 113A to 113D, and selects, as a detection electrode, the sensor adjacent to the sensor selected as a drive electrode.

For example, in the case where the sensor 113A is selected as a drive electrode, the sensor 113C adjacent to the sensor 113A with the rim of the steering core 111 interposed therebetween or the sensor 113B located on the opposite side of the rim of the steering core 111 may be selected as a detection electrode. In the case where the sensor 113C is selected as a drive electrode, the sensor 113A adjacent to the sensor 113C with the rim of the steering core 111 interposed therebetween or the sensor 113D located on the opposite side of the rim of the steering core 111 may be selected as a detection electrode. Similarly, in the case where the sensor 113B is selected as a drive electrode, the sensor 113D adjacent to the sensor 113B with the rim of the steering core 111 interposed therebetween or the sensor 113A located on the opposite side of the rim of the steering core 111 may be selected as a detection electrode. In the case where the sensor 113D is selected as a drive electrode, the sensor 113B adjacent to the sensor 113D with the rim of the steering core 111 interposed therebetween or the sensor 113C located on the opposite side of the rim of the steering core 111 may be selected as a detection electrode.

The processing proceeds to step S5 in the case where any one of the measured electrostatic capacitances is determined to be equal to or larger than the threshold value Th2 in step S2 and the electrostatic capacitance is determined to be smaller than the threshold value Th1 in step S3, in other words, in the case where there is a possibility that the hand H may not be in contact with the rim 110A of the steering wheel 110 at a portion that overlaps the sensors 113A to 113D but may be in contact with, for example, the seam 112A or the dead zone where no sensor is present, although a certain large electrostatic capacitance is detected.

The contact determiner 132 acquires an electrostatic capacitance between the drive electrode and the detection electrode using the drive electrode and the detection electrode selected in step S5 (step S6).

In step S5, instead of selecting the sensor that has detected the electrostatic capacitance equal to or larger than the threshold value Th2 in step S2 as the drive electrode, each of the sensors 113A to 113D may be selected as a drive electrode, and a drive electrode and a detection electrode may be selected in a round-robin manner. In this case, the process of selecting a drive electrode and a detection electrode in step S5 and the process of detecting an electrostatic capacitance between the drive electrode and the detection electrode in step S6 may be repeatedly performed.

Herein, selecting a drive electrode and a detection electrode in a round-robin manner means measuring a respective electrostatic capacitance (mutual capacitance) between the drive electrode and the detection electrode in the case where all the sensors are selected as a drive electrode by sequentially selecting all the sensors as a drive electrode and selecting the sensor adjacent to the selected drive electrode as a detection electrode.

The contact determiner 132 determines whether the acquired electrostatic capacitance is equal to or larger than a threshold value Th3 (step S7). The threshold value Th3 is an example of a third threshold value, and is set to an electrostatic capacitance with which it can be determined, in the mutual capacitance detection mode, whether the hand H is in contact with the rim 110A of the steering wheel 110 at the seam 112A or the dead zone where no sensor is present.

When the contact determiner 132 determines that the acquired electrostatic capacitance is equal to or larger than the threshold value Th3 (Yes in step S7), the contact determiner 132 determines that the hand H is in contact with the rim 110A of the steering wheel 110 (step S4). The processing proceeds to step S4 via step S7 in the case where the hand H is in contact with the rim 110A of the steering wheel 110 at the seam 112A or the dead zone where no sensor is present.

When the contact determiner 132 determines that the acquired electrostatic capacitance is not equal to or larger than the threshold value Th3 in step S7 (No in step S7), the contact determiner 132 determines that the hand H is not in contact with the rim 110A of the steering wheel 110 (step S8). For example, in the case where the hand H is in contact with the rim 110A of the steering wheel 110 at the seam 112A or the dead zone where no sensor is present at the time when the electrostatic capacitances were acquired in step S1 but the hand H is no longer in contact with the rim 110A of the steering wheel 110 at the time when the electrostatic capacitance was acquired in step S6, the processing proceeds from step S7 to step S8. When the contact determiner 132 completes the processing in step S8, the HODECU 130 transmits the determination result to the ADASECU 200, and returns the processing to the beginning.

When determining in step S2 that there is no electrostatic capacitance equal to or larger than the threshold value Th2 among the calculated electrostatic capacitances (ΔAD) (No in step S2), the contact determiner 132 determines whether there is an electrostatic capacitance equal to or larger than a threshold value Th4 larger than the initial values among the electrostatic capacitances (raw values) of the sensors 113A to 113D acquired in step S1 (step S9). The threshold value Th4 is an example of a fourth threshold value. An initial value is a value that is output from each of the sensors 113A to 113D in a state where the hand H is not in contact with the steering wheel 110. Such an initial value is a value determined depending on a configuration of each of the sensors 113A to 113D, and may be held in an internal memory of the HODECU 130, for example. To set the threshold value Th4, the sensitivity for determining whether the hand H is in contact with the steering wheel 110 can be adjusted depending on a degree of increase from the initial value.

The threshold value Th4 is set to an electrostatic capacitance with which it can be determined, in the self capacitance detection mode, that the hand H is in light contact with the rim 110A of the steering wheel 110 at any part including the seam 112A and the dead zone where no sensor is present. Step S9 is a process of determining which sensor (one of the sensors 113A to 113D) the hand H is close to when the hand H is in light contact with any part of the rim 110A by checking an increase in the electrostatic capacitances (raw values) of the sensors 113A to 113D acquired in step S1. In the case where the hand H lightly touches somewhere on the rim 110A or the hand H is close to the rim 110A of the steering wheel 110, it is possible to narrow down the sensors to one sensor in step S9.

When the contact determiner 132 determines that there is an electrostatic capacitance equal to or larger than the threshold value Th4 among the electrostatic capacitances of the sensors 113A to 113D (Yes in step S9), the contact determiner 132 causes the mode switcher 131 to switch the mode to the mutual capacitance detection mode (step S10). The mode switcher 131 selects, as a drive electrode, the sensor with which the electrostatic capacitance is determined to be equal to or larger than the threshold value Th4 in step S9 among the sensors 113A to 113D, and selects, as a detection electrode, the sensor adjacent to the sensor selected as a drive electrode.

The contact determiner 132 acquires an electrostatic capacitance between the drive electrode and the detection electrode using the drive electrode and the detection electrode selected in step S10 (step S11).

The contact determiner 132 determines whether the acquired electrostatic capacitance is equal to or larger than a threshold value Th5 (step S12). The threshold value Th5 is an example of a fifth threshold value, and is set to an electrostatic capacitance with which it can be determined, in the mutual capacitance detection mode, whether the hand H is in contact with the rim 110A of the steering wheel 110 at the seam 112A or the dead zone where no sensor is present. The processing in step S12 is the same as the processing in step S7, but the threshold values are different. The processing proceeds to step S12 in the case where it is determined that there is no electrostatic capacitance equal to or larger than the threshold value Th2 among the electrostatic capacitances (ΔAD) calculated in step S2 (No in step S2), in other words, in the case where the hand H is not in contact with the rim 110A of the steering wheel 110 at any part including the seam 112A and the dead zone where no sensor is present.

The threshold value Th3 used in step S7 is an electrostatic capacitance with which it can be determined, in the mutual capacitance detection mode, whether the hand H is in contact with the rim 110A of the steering wheel 110 at the seam 112A or the dead zone where no sensor is present. In contrast, the threshold value Th5 used in step S12 is smaller than the threshold value Th3, because the threshold value Th5 is an electrostatic capacitance with which it can be determined, in the mutual capacitance detection mode, whether the hand H is in contact with the rim 110A of the steering wheel 110 at the seam 112A or the dead zone where no sensor is present.

In the case where the contact determiner 132 determines that the acquired electrostatic capacitance is equal to or larger than the threshold value Th5 (Yes in step S12), the HODECU 130 determines that the hand H is in contact with the rim 110A of the steering wheel 110 (step S4). The processing proceeds to step S4 via step S12 in the case where the hand H is in contact with the rim 110A of the steering wheel 110 at a dead zone, such as the seam 112A, where no sensor is present.

In the case where the contact determiner 132 determines that the acquired electrostatic capacitance is not equal to or larger than the threshold value Th5 (No in step S12), the HODECU 130 determines that the hand H is not in contact with the rim 110A of the steering wheel 110 (step S8). The processing proceeds from step S12 to step S8 in the case where, for example, the hand H is in very light contact with the rim 110A of the steering wheel 110 at the seam 112A or the dead zone where no sensor is present at a time when the electrostatic capacitances were acquired in step S1, but the hand H is no longer in contact with the rim 110A of the steering wheel 110 at the time when the electrostatic capacitance was acquired in step S11.

When the contact determiner 132 determines that there is no electrostatic capacitance equal to or larger than the threshold value Th4 among the electrostatic capacitances of the sensors 113A to 113D in step S9 (No in step S9), the HODECU 130 determines that the hand H is not in contact with the rim 110A of the steering wheel 110 (step S8). The processing proceeds from step S9 to step S8 in the case where, for example, the hand H is off of the rim 110A of the steering wheel 110.

<Description of Threshold Values>

<Threshold Value Th1>

Figure 5A:
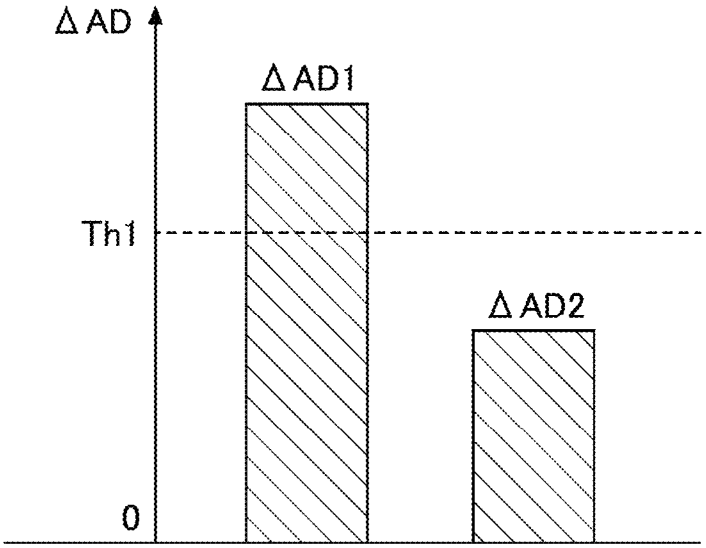
FIG. 5A is a diagram illustrating a threshold value Th1 used by a contact determiner.

FIG. 5A is a diagram illustrating the threshold value Th1 used by the contact determiner 132 in the processing in step S3. In FIG. 5A, the vertical axis represents the electrostatic capacitance ΔAD as a difference value (ΔAD) calculated by subtracting a predetermined reference value from the digitally converted value (raw value).

Since the threshold value Th1 is set to a value with which detection of firm gripping of the rim 110A with the hand H at a portion other than the seam 112A or the dead zone where no sensor is present in the self capacitance detection mode, the threshold value Th1 is set to a largest value among the threshold values used by the contact determiner 132 in the processing shown in FIG. 4.

In the case where the contact determiner 132 determines in step S2 that there is an electrostatic capacitance equal to or larger than the threshold value Th2 among the acquired electrostatic capacitances (ΔAD) (Yes in step S2), the contact determiner 132 determines whether the electrostatic capacitance is equal to or larger than the threshold value Th1 (step S3). When the electrostatic capacitance is equal to or larger than the threshold value Th1, like the electrostatic capacitance ΔAD1 illustrated in FIG. 5A, the contact determiner 132 determines that the hand H is in contact with the rim 110A of the steering wheel 110 (step S4).

On the other hand, when the electrostatic capacitance illustrated in FIG. 5A is smaller than the threshold value Th1, like the electrostatic capacitance ΔAD2, the contact determiner 132 determines that there is a possibility that the hand H is not in contact with the rim 110A of the steering wheel 110, and the processing proceeds to step S5.

<Threshold Value Th2>

Figure 5B:
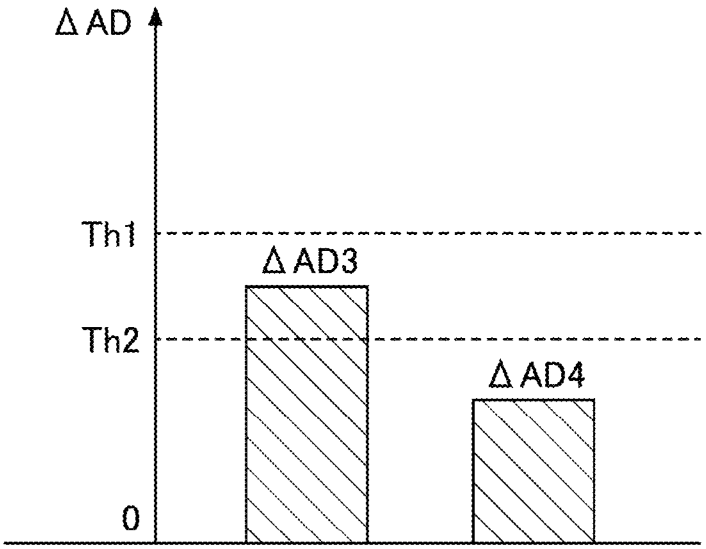
FIG. 5B is a diagram illustrating a threshold value Th2 used by the contact determiner.

FIG. 5B is a diagram illustrating the threshold value Th2 used by the contact determiner 132 in the processing in step S2. In FIG. 5B, the vertical axis represents the electrostatic capacitance ΔAD as a difference value (ΔAD) calculated by subtracting a predetermined reference value from the digitally converted value (raw value).

The threshold value Th2 is smaller than the threshold value Th1 because the threshold value Th2 is set to an electrostatic capacitance with which it can be determined, in the self capacitance detection mode, that the hand H is in contact with the rim 110A of the steering wheel 110 at any part including the seam 112A and the dead zone where no sensor is present, and with which a state where the hand H is in contact with the dead zone of the rim 110A can also be determined. The threshold value Th1 is also illustrated in FIG. 5B.

In step S2, the contact determiner 132 determines whether or not there is an electrostatic capacitance equal to or larger than the threshold value Th2 among all the electrostatic capacitances measured by the capacitance measurer 120 in step S1. When the contact determiner 132 determines that the electrostatic capacitance is equal to or larger than the threshold value Th2, like the electrostatic capacitance ΔAD3 illustrated in FIG. 5B, the processing proceeds to step S3. On the other hand, when the contact determiner 132 determines that all the electrostatic capacitances measured by the capacitance measurer 120 in step S1 are smaller than the threshold value Th2, like the electrostatic capacitance ΔAD4 illustrated in FIG. 5B, the processing proceeds to step S9.

<Threshold Value Th4>

Figure 6:
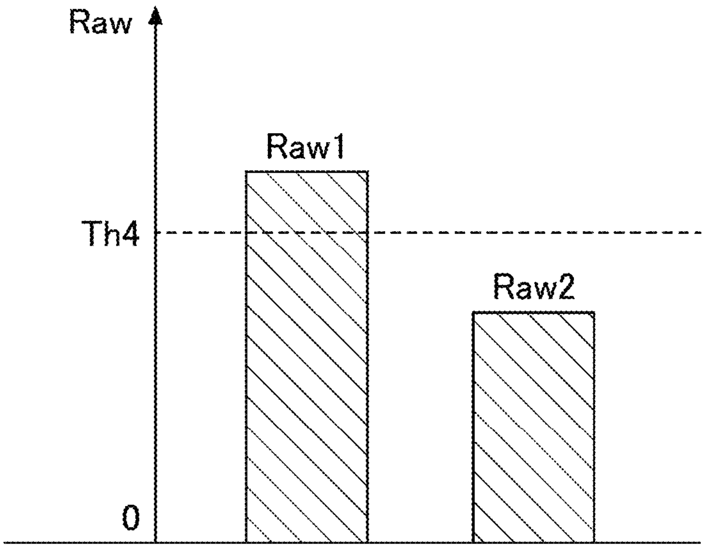
FIG. 6 is a diagram illustrating a threshold value Th4 used by the contact determiner.

FIG. 6 is a diagram illustrating the threshold value Th4 used by the contact determiner 132 in the processing in step S9. In FIG. 6, the vertical axis represents an electrostatic capacitance (raw value) measured by the capacitance measurer 120 in the self capacitance detection mode.

The threshold value Th4 is set to an electrostatic capacitance with which it can be determined that, in the self capacitance detection mode, the hand H is lightly in contact with the rim 110A of the steering wheel 110 at any part, and is not a difference value (ΔAD) that represents a difference from the predetermined reference value but a digitally converted value (raw value) before the difference value (ΔAD) is calculated. This is to capture a slight change in an electrostatic capacitance (raw value) that is digitally converted and output by the capacitance measurer 120.

When the contact determiner 132 determines that there is an electrostatic capacitance equal to or larger than the threshold value Th4 among the electrostatic capacitances of the sensors 113A to 113D in step S9 (Yes in step S9), the processing proceeds to step S10, as there is a possibility that the hand H may be in light contact with the rim 110A of the steering wheel 110. When the contact determiner 132 determines that the electrostatic capacitance is equal to or larger than the threshold value Th4, like the electrostatic capacitance Raw1 illustrated in FIG. 6, the processing proceeds to step S10.

On the other hand, when the electrostatic capacitance is smaller than the threshold value Th4, like the electrostatic capacitance Raw2 illustrated in FIG. 6, the contact determiner 132 determines that the hand H is not in contact with the rim 110A of the steering wheel 110 (step S8).

<Threshold Value Th3>

Figure 7A:
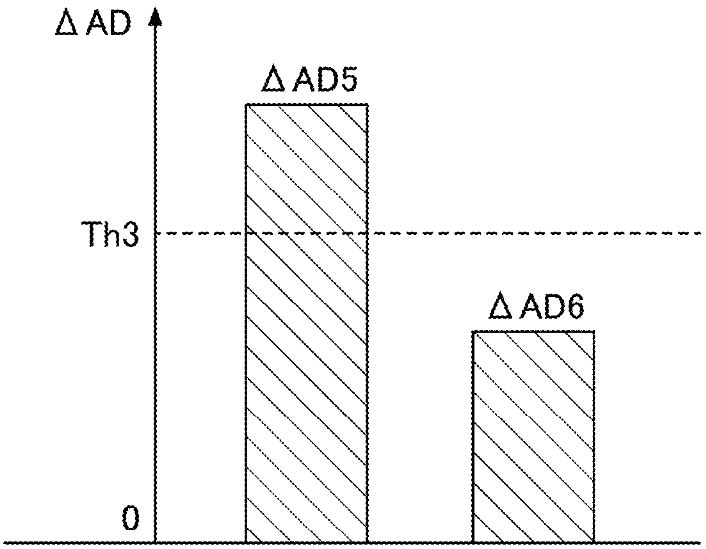
FIG. 7A is a diagram illustrating a threshold value Th3 used by a contact determiner.

FIG. 7A is a diagram illustrating the threshold value Th3 used by the contact determiner 132 in the processing in step S7. In FIG. 7A, the vertical axis represents an electrostatic capacitance ΔAD measured by the capacitance measurer 120 in the mutual capacitance detection mode.

The threshold value Th3 is set to an electrostatic capacitance with which it can be determined, in the mutual capacitance detection mode, whether the hand H is in contact with the rim 110A of the steering wheel 110 at the seam 112A or the dead zone where no sensor is present.

When the contact determiner 132 determines in step S7 that the electrostatic capacitance ΔAD5 illustrated in FIG. 7A is equal to or larger than the threshold value Th3, the contact determiner 132 determines that the hand H is in contact with the rim 110A of the steering wheel 110 (step S4). After it is determined in step S2 that the hand H is in contact with the rim 110A at least at any part and it is determined in step S3 that the hand H is not in contact with a position that overlaps at least one of the sensors 113A to 113D, a state in which the hand H is in contact with the rim 110A of the steering wheel 110 at the seam 112A or the dead zone where no sensor is present is detected.

When the contact determiner 132 determines that the electrostatic capacitance ΔAD6 illustrated in FIG. 7A is not equal to or larger than the threshold value Th3 in step S7 (No in step S7), the contact determiner 132 determines that the hand H is not in contact with the rim 110A of the steering wheel 110 (step S8).

<Threshold Value Th5>

Figure 7B:
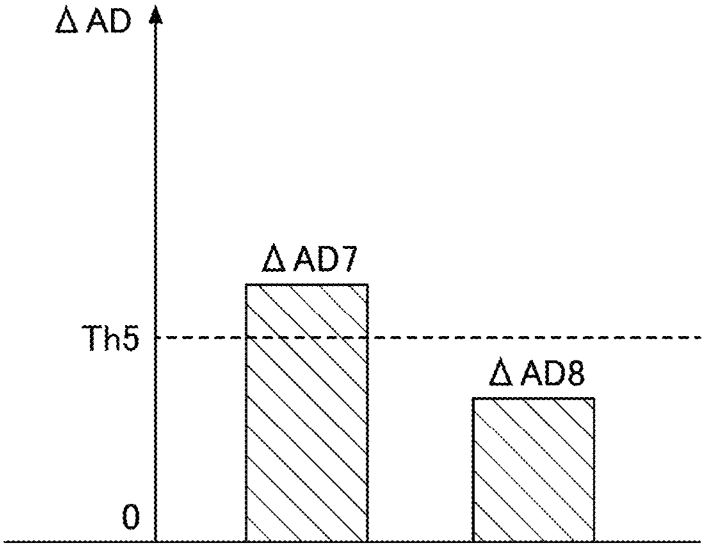
FIG. 7B is a diagram illustrating a threshold value Th5 used by the contact determiner.

FIG. 7B is a diagram illustrating the threshold value Th5 used by the contact determiner 132 in the processing in step S12. In FIG. 7B, the vertical axis represents an electrostatic capacitance ΔAD measured by the capacitance measurer 120 in the self capacitance detection mode.

The threshold value Th5 is set to an electrostatic capacitance with which it can be determined, in the mutual capacitance detection mode, whether the hand H is in contact with the rim 110A of the steering wheel 110 at the seam 112A or the dead zone where no sensor is present. The case where the processing proceeds to step S12 is different from the case where the processing proceeds to step S7 in that it is determined that there is no electrostatic capacitance equal to or larger than the threshold value Th2 among the electrostatic capacitances (ΔAD) calculated in step S2 (No in step S2).

The threshold value Th5 is used to simply detect contact of the hand H with the rim 110A of the steering wheel 110 at the seam 112A or the dead zone where no sensor is present, and is therefore smaller than the threshold value Th3, which is used or determining whether the hand H is in contact with the rim 110A at the seam 112A of or the dead zone where no sensor is present.

When the contact determiner 132 determines in step S12 that the electrostatic capacitance ΔAD7 illustrated in FIG. 7B is equal to or larger than the threshold value Th5, the contact determiner 132 determines that the hand H is in contact with the rim 110A of the steering wheel 110 (step S4). It can be understood from the determination that the hand H is simply in contact with the rim 110A of the steering wheel 110 at the seam 112A or the dead zone where no sensor is present.

When the contact determiner 132 determines in step S12 that the electrostatic capacitance ΔAD8 illustrated in FIG. 7B is not equal to or larger than the threshold value Th5, the contact determiner 132 determines that the hand H is not in contact with the rim 110A of the steering wheel 110 (step S8). It can be understood from the determination that the hand H is not in contact with the rim 110A of the steering wheel 110 even at the seam 112A or the dead zone where no sensor is present.

<Effects>

The steering wheel unit 100 includes the steering wheel 110 having the rim 110A, the spokes 110B, and the sensors 113A to 113D arranged inside the rim 110A; the mode switcher 131 that selects any one of the sensors 113A to 113D as a drive electrode or a detection electrode and enables switching between the self capacitance detection mode and the mutual capacitance detection mode; the capacitance measurer 120 that measures an electrostatic capacitance detected by the drive electrode and the detection electrode; and the contact determiner 132 that determines whether the operator's hand H is in contact with the steering wheel 110 based on the electrostatic capacitances measured by the capacitance measurer 120. The mode switcher 131 selects a drive electrode from the sensors 113A to 113D and selects the electrode adjacent to the selected drive electrode as a detection electrode in the mutual capacitance detection mode. When the electrostatic capacitance measured by the capacitance measurer 120 is equal to or larger than the threshold value Th1 in the self capacitance detection mode, which is set by the mode switcher 131, the contact determiner 132 determines that the operator's hand H is in contact with the rim 110A at a position that overlaps at least one of the sensors 113A to 113D. When the electrostatic capacitance measured by the capacitance measurer 120 is equal to or larger than the threshold value Th2, which is smaller than the threshold value Th1, and is smaller than the threshold value Th1, the contact determiner 132 causes the mode switcher 131 to switch the mode from the self capacitance detection mode to the mutual capacitance detection mode. After the mode switching, when the electrostatic capacitance measured by the capacitance measurer 120 is equal to or larger than the threshold value Th3, the contact determine 132 determines that the operator's hand H is in contact with the rim 110A at a position that overlaps a gap between the sensors 113A to 113D. Therefore, even when it is determined that the operator's hand H is not in contact with the rim 110A in the self capacitance detection mode, it is possible to determine whether or not the hand H is in contact by measuring the electrostatic capacitance in the mutual capacitance detection mode.

Therefore, the steering wheel unit 100 is capable of determining whether there is a contact of an operator's hand H with the rim 110A of the steering wheel 110 at a dead zone where no sensor is present can be provided.

When the electrostatic capacitance measured by the capacitance measurer 120 in the mutual capacitance detection mode is smaller than the threshold value Th3, the contact determiner 132 determines that the hand H is not in contact with the rim 110A. Therefore, it is possible to determine that the operator's hand H is not in contact with the dead zone where no sensor is present.

When the electrostatic capacitance measured by the capacitance measurer 120 in the self capacitance detection mode is smaller than the threshold value Th2 and is equal to or larger than the threshold value Th4, the contact determiner 132 causes the mode switcher 131 to switch the mode from the self capacitance detection mode to the mutual capacitance detection mode. After the mode switching, when the electrostatic capacitance measured by the capacitance measurer 120 is equal to or larger than the threshold value Th5, the contact determiner 132 determines that the operator's hand H is in contact with the rim 110A at a position that overlaps a gap between the sensors 113A to 113D. Therefore, even when the electrostatic capacitance measured by the capacitance measurer 120 in the self capacitance detection mode is small, for example smaller than the threshold value Th2, it is possible to determine that the operator's hand H is in contact with the dead zone where no sensor is present.

When the electrostatic capacitance measured by the capacitance measurer 120 in the mutual capacitance detection mode is smaller than the threshold value Th5, the contact determiner 132 determines that the hand H is not in contact with the rim 110A. Therefore, even when the electrostatic capacitance measured by the capacitance measurer 120 in the self capacitance detection mode is small, for example smaller than the threshold value Th2, it is possible to determine that the operator's hand H is not in contact in the dead zone where no sensor is present.

The threshold value Th5 is smaller than the threshold value Th3. The threshold value Th5 is used to simply detect contact of the hand H with the rim 110A of the steering wheel 110 at the seam 112A or the dead zone where no sensor is present, and thus the threshold value Th5 is smaller than the threshold value Th3 used for determining a state where the hand H is in contact with the rim 110A at the seam 112A or the dead zone where no sensor is present.

The threshold value Th4 is a threshold used for comparison with an electrostatic capacitance (raw value), which is not an electrostatic capacitance calculated by subtracting a reference value from the electrostatic capacitance measured by the capacitance measurer 120 in the self capacitance detection mode. Therefore, it is possible to determine that the operator's hand H is in contact in the dead zone where no sensor is present by capturing a slight change in an electrostatic capacitance (raw value) which is digitally converted and output by the capacitance measurer 120.

In the case where the electrostatic capacitance measured by the capacitance measurer 120 is equal to or larger than the threshold value Th2, the contact determiner 132 determines whether the electrostatic capacitance measured by the capacitance measurer 120 is equal to or larger than the threshold value Th1. Therefore, it is possible to distinguish between the case where the hand H is in contact with the seam 112A or the dead zone where no sensor is present and the case where the hand H is in contact with some other part of the rim 110A.

The gap between the sensors 113A to 113D is located at the seam 112A or the joint of the exterior 112 covering the rim 110A. Therefore, it is possible to determine whether the operator's hand H is in contact with the rim 110A at a dead zone, such as the seam 112A or the joint of the exterior 112.

MODIFIED EXAMPLES

Figure 8:
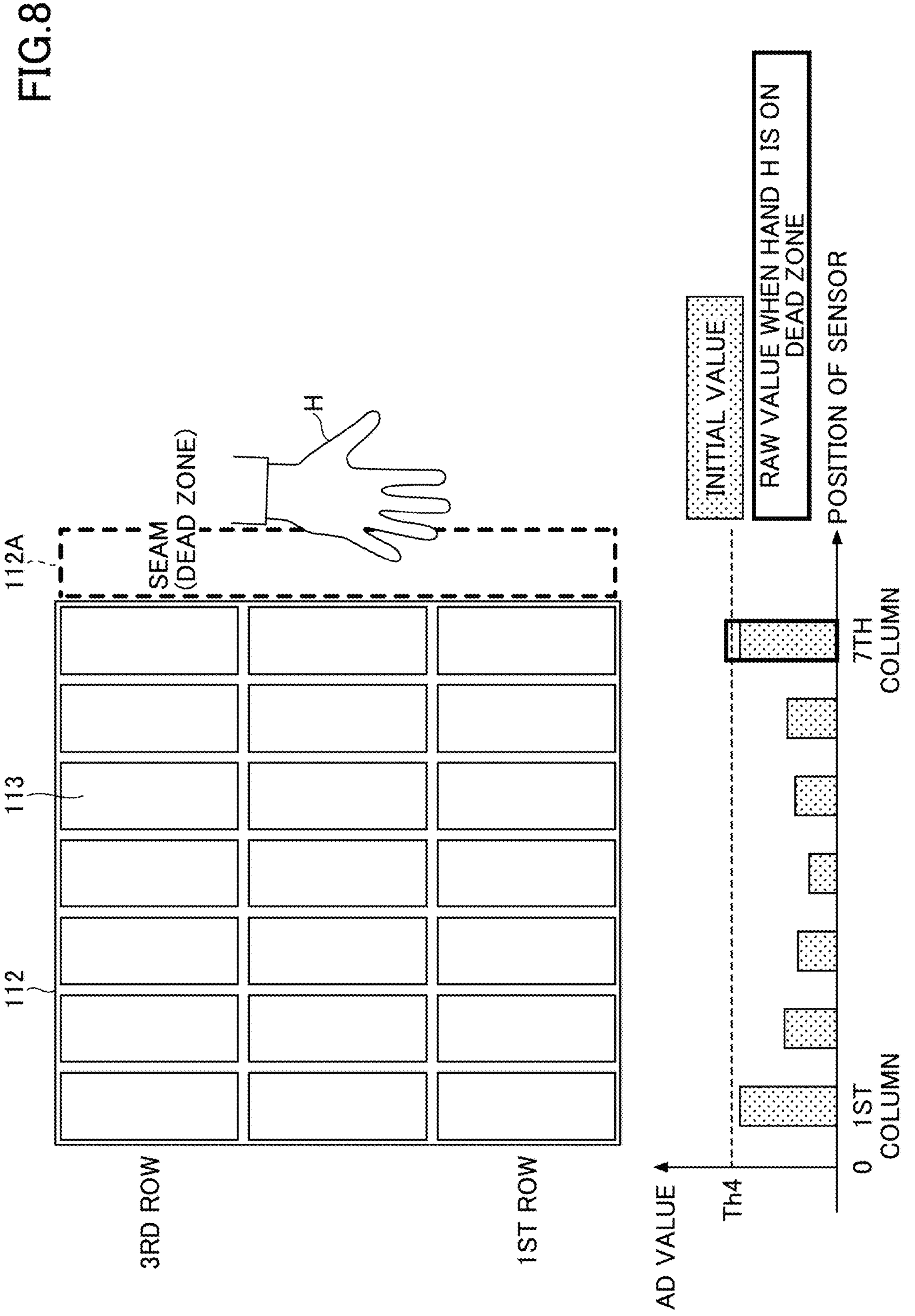
FIG. 8 is a diagram illustrating a configuration of sensors according to a modified example of the embodiment.

FIG. 8 is a diagram illustrating a configuration of the sensors 113 according to a modified example of the embodiment. Although the four sensors 113A to 113D are provided in the steering wheel 110 in the embodiment described with reference to FIGS. 1 to 3, the number of sensors is not limited to four, and may be more than four, for example.

FIG. 8 illustrates 21 sensors 113 arranged in seven columns and three rows, and initial values (raw values) of the electrostatic capacitances of the seven sensors in the second row measured by the capacitance measurer 120. These 21 sensors 113 are provided on a sheet-like surface exterior 112 (see FIG. 1). The seam 112A as a dead zone is positioned at a portion corresponding to the eighth column of the sensors 113 in the arrangement of three rows and seven columns. For example, when the exterior is wound around the rim of steering core 111, the seam 112A is located between the sensor 113 in the first column and the sensor 113 in the seventh column.

Hereinafter, processing performed by the HODECU 130 in the case where the operator's hand H is in contact with the seam 112A at the dead zone, which is at the position corresponding to the eighth column of the second row, will be described.

When the processing is started, the contact determiner 132 causes the mode switcher 131 to set the self capacitance detection mode, and acquires electrostatic capacitances sequentially measured in 21 sensors 113 in a time-division manner by the capacitance measurer 120 (step S1). In step S1, the contact determiner 132 acquires a digitally converted value (raw value), which is the electrostatic capacitance acquired by the capacitance measurer 120.

In step S1, the mode switcher 131 may drive 20 sensors other than the sensor that detects an electrostatic capacitance as a shield. The contact determiner 132 may cause the mode switcher 131 to perform such processing. By driving those 20 sensors other than the sensor that detects an electrostatic capacitance as a shield, it is possible to suppress the influence of the ground or the like in the vicinity of the sensor that detects an electrostatic capacitance, and to stably detect an electrostatic capacitance.

The contact determiner 132 calculate an electrostatic capacitance as a difference value (ΔAD) by subtracting a predetermined reference value from the digitally converted value (raw value), and determines whether or not there is an electrostatic capacitance equal to or larger than a threshold value Th2 among the acquired electrostatic capacitances (step S2). Since the operator's hand H is in contact with the seam 112A, the electrostatic capacitance is smaller than the threshold value Th2, and the process proceeds to step S9.

Herein, the initial value (raw value) of the electrostatic capacitance of each sensor acquired by the capacitance measurer 120 will be described.

The positions of the 21 sensors in relation to the seam 112A differ between the first to seventh columns, and the number of sensors 113 positioned in the lateral direction on the left and right of the sensors differs between the first to seventh columns. For example, the sensor in the second row and the sixth column is positioned at the second left and the sixth right from the seam 112A, and the initial value (raw value) of the electrostatic capacitance is lower than that of the sensor in the second row and the seventh column. This is because the more sensors are present between the seam 112A and the steering wheel 110, the smaller the capacitive coupling with the ground in the vicinity, such as the steering wheel 110, and the lower the initial value. Therefore, the 21 sensors have different initial values of the electrostatic capacitances (raw values) measured by the capacitance measurer 120 in the first to seventh columns and the first to third rows. The initial value is an electrostatic capacitance (raw value) in the case where the hand H is not in contact with the seam 112A.

In step S9, the contact determiner 132 determines that the electrostatic capacitances (raw values) of the sensors 113 of the first column and the seventh column adjacent to the seam 112A exceed the threshold value Th4, using the sensors 113 of each row and each column, and is able to detect a possibility that the hand H may be in contact with the seam 112A, and the processing proceeds to step S10.

The processing in steps S10 to S12 is as described above.

Although the steering wheel unit according to the exemplary embodiment of the present disclosure has been described above, the present disclosure is not limited to the specifically disclosed embodiment, and various modifications and changes can be made without departing from the scope of the claims.

What is claimed is:

1. A steering wheel unit, comprising:

a steering wheel including a rim, spokes, and a plurality of electrodes arranged with a gap from each other and covering the rim;

a mode switcher configured to switch between a self capacitance detection mode and a mutual capacitance detection mode for the plurality of electrodes;

a capacitance measurer configured to measure a respective first electrostatic capacitance at each of the plurality of electrodes; and a contact determiner configured to determine whether or not an operator's hand is in contact with the steering wheel based on the first electrostatic capacitances measured by the capacitance measurer, wherein the mode switcher selects, in the mutual capacitance detection mode, a drive electrode from the plurality of electrodes and selects an electrode adjacent to the selected drive electrode as a detection electrode, in the self capacitance detection mode that is set by the mode switcher, when any one of the first electrostatic capacitances measured by the capacitance measurer is equal to or larger than a first threshold value, the contact determiner determines that the operator's hand is in contact with the rim at a position that overlaps at least one of the plurality of electrodes, when the any one first electrostatic capacitance measured by the capacitance measurer is equal to or larger than a second threshold value and smaller than the first threshold value, the second threshold value being smaller than the first threshold value, the contact determiner causes the mode switcher to switch the self capacitance detection mode to the mutual capacitance detection mode, and after the switching, when a second electrostatic capacitance measured by the capacitance measurer in the mutual capacitance detection mode is equal to or larger than a third threshold value, a control unit determines that the operator's hand is in contact with the rim at a position that overlaps a gap between the electrodes.

2. The steering wheel unit according to claim 1, wherein when the second electrostatic capacitance measured by the capacitance measurer in the mutual capacitance detection mode is smaller than the third threshold value, the contact determiner determines that the operator's hand is not in contact with the rim.

3. The steering wheel unit according to claim 1, wherein when any one of the first electrostatic capacitances measured by the capacitance measurer in the self capacitance detection mode is smaller than the second threshold value and any one of the first electrostatic capacitances measured by the capacitance measurer is equal to or larger than a fourth threshold value, the self capacitance detection mode is switched to the mutual capacitance detection mode by the mode switcher, after the switching, when a third electrostatic capacitance measured by the capacitance measurer is equal to or larger than a fifth threshold value, the contact determiner determines that the operator's hand is in contact with the rim at a position that overlaps a gap between the electrodes.

4. The steering wheel unit according to claim 3, wherein when the third electrostatic capacitance measured by the capacitance measurer in the mutual capacitance detection mode is smaller than the fifth threshold value, the contact determiner determines that the operator's hand is not in contact with the rim.

5. The steering wheel unit according to claim 3, wherein the fifth threshold value is smaller than the third threshold value.

6. The steering wheel unit according to claim 3, wherein the fourth threshold value is a threshold value used for comparing with the first electrostatic capacitances measured by the capacitance measurer in the self capacitance detection mode and from which a reference value is not subtracted.

7. The steering wheel unit according to claim 1, wherein when any one of the first electrostatic capacitances measured by the capacitance measurer is equal to or larger than the second threshold value, the contact determiner determines whether the any one first electrostatic capacitance measured by the capacitance measurer is equal to or larger than the first threshold value.

8. The steering wheel unit according to claim 1, wherein a gap between the plurality of electrodes is located at a seam or a joint of an exterior covering the rim.

* * * * *